(12) United States Patent
Hsu et al.

(10) Patent No.: US 8,013,255 B2
(45) Date of Patent: Sep. 6, 2011

(54) PRINTED CIRCUIT BOARD WITH HIGH DENSITY DIFFERENTIAL PAIRS

(75) Inventors: Shou-Kuo Hsu, Taipei Hsien (TW); Chun-Jen Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 694 days.

(21) Appl. No.: 12/126,748

(22) Filed: May 23, 2008

(65) Prior Publication Data

US 2009/0242244 A1   Oct. 1, 2009

(30) Foreign Application Priority Data

Mar. 28, 2008   (CN) .......................... 2008 1 0300775

(51) Int. Cl.
*H05K 1/03* (2006.01)

(52) U.S. Cl. ....................................... 174/255; 174/254

(58) Field of Classification Search ................... 174/255, 174/254
See application file for complete search history.

(56) References Cited

U.S. PATENT DOCUMENTS

2005/0067187 A1*   3/2005   Hsu ............................... 174/255

\* cited by examiner

*Primary Examiner* — Ishwarbhai Patel
(74) *Attorney, Agent, or Firm* — Altis Law Group, Inc.

(57) ABSTRACT

An exemplary PCB includes a first reference layer, a first signal layer, and a second signal layer in that order. A first differential pair is arranged in the first signal layer in an edge-coupled structure referencing the first reference layer. A second differential pair is arranged in the second signal layer in edge-coupled structure. A first ground part and a second ground part are symmetrically arranged in the second signal layer and at opposite sides of the second differential pair. The first differential pair is arranged above the first ground part such that a projection of the first differential pair onto the second signal layer having an area coincident with the first ground part. The second differential pair references the first and second ground parts.

4 Claims, 2 Drawing Sheets

PRINTED CIRCUIT BOARD WITH HIGH DENSITY DIFFERENTIAL PAIRS

CROSS-REFERENCES TO RELATED APPLICATION

Relevant subject matter is disclosed in a co-pending U.S. patent application entitled "PRINTED CIRCUIT BOARD", filed on Dec. 15, 2007 with application Ser. No. 11/957,416, and assigned to the same assignee as the present application.

BACKGROUND

1. Field of the Invention

The present invention relates to a printed circuit board (PCB), and particularly to a PCB with a high density layout of differential pairs and less noise signals.

2. Description of Related Art

Differential pairs are often used in a multi-layer PCB to transmit signals. Referring to FIG. 2, a conventional PCB has edge-coupled differential pairs 17, 18 defined in a signal layer 12, edge-coupled differential pairs 19, 20 defined in a signal layer 13, and edge-coupled differential pairs 21, 22 defined in a signal layer 15 to transmit signals. A reference layer 11 is disposed above the differential pairs 17, 18, a reference layer 14 is disposed below the differential pairs 19, 20, and reference layers 14, 16 are disposed above and below the differential pairs 21, 22. In the PCB of FIG. 2, there are three layers 11, 14, and 16 acting as reference layers, and three layers 12, 13 and 15 acting as signal layers. Because in the conventional PCB, the edge-coupled differential pairs are used to transmit signals, there must be at least one reference layer disposed near the signal layer where the differential pairs are defined to obtain good signal quality, and at least one inner layer of the PCB occupied as the reference layer, therefore the density of the layout of differential pairs is not maximized. Furthermore, noise signals are produced in the differential pairs when two signal layers are too close to each other.

What is needed, therefore, is a PCB with a high density layout of differential pairs and less noise signals.

SUMMARY

An exemplary PCB includes a first reference layer, a first signal layer, and a second signal layer in that order. A first differential pair is arranged in the first signal layer in an edge-coupled structure referencing the first reference layer. A second differential pair is arranged in the second signal layer in edge-coupled structure. A first ground part and a second ground part are symmetrically arranged at opposite sides of the second differential pair in the second signal layer. The first differential pair is arranged above the first ground part and a projection of the first differential pair onto the second signal layer having an area coincident with the first ground part. The second differential pair references the first and second ground parts.

Other advantages and novel features will become more apparent from the following detailed description when taken in conjunction with the accompanying drawings, in which:

DETAILED DESCRIPTION

Figure 1:
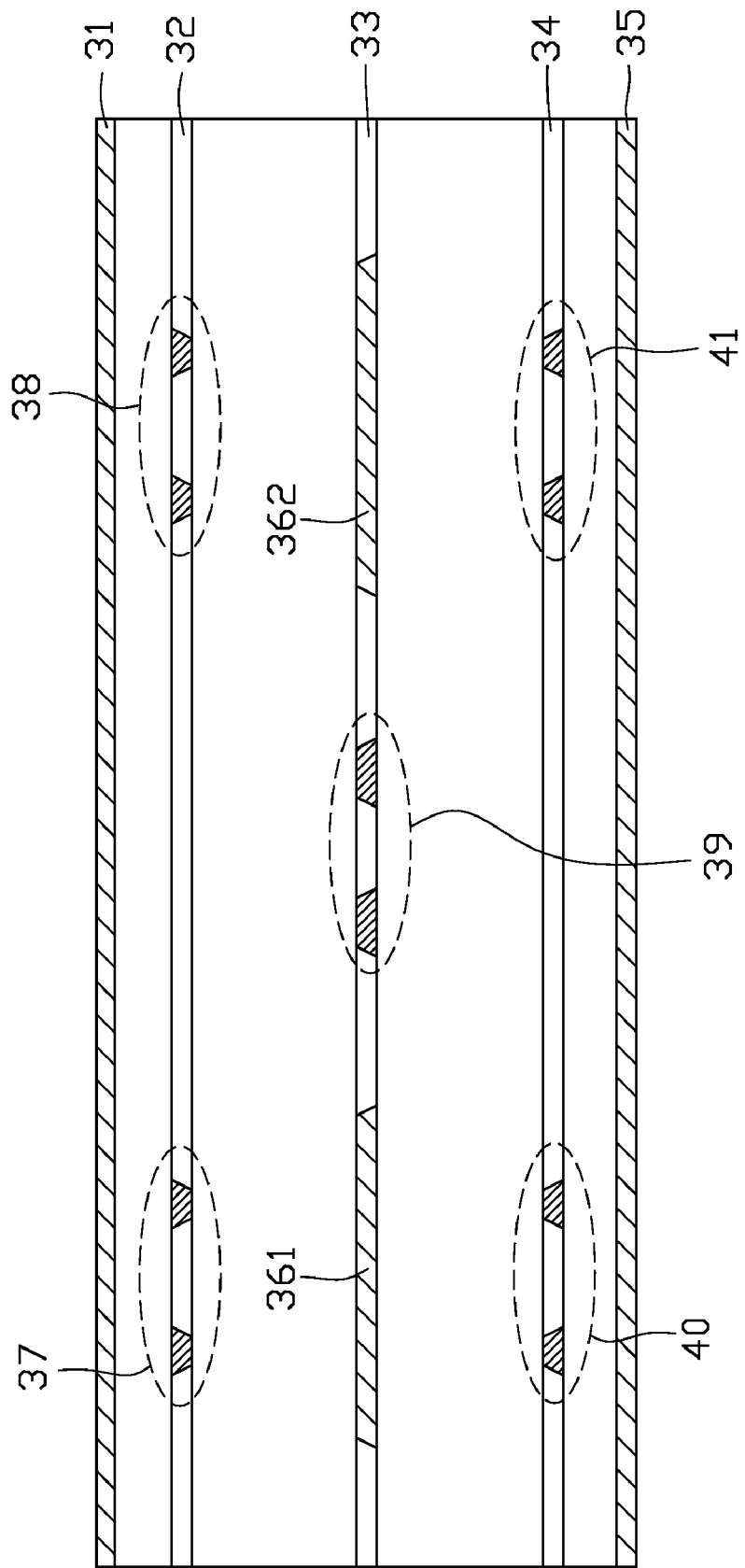
FIG. 1 is a cross-sectional view of a PCB according to an exemplary embodiment of the present invention.
Figure 2:
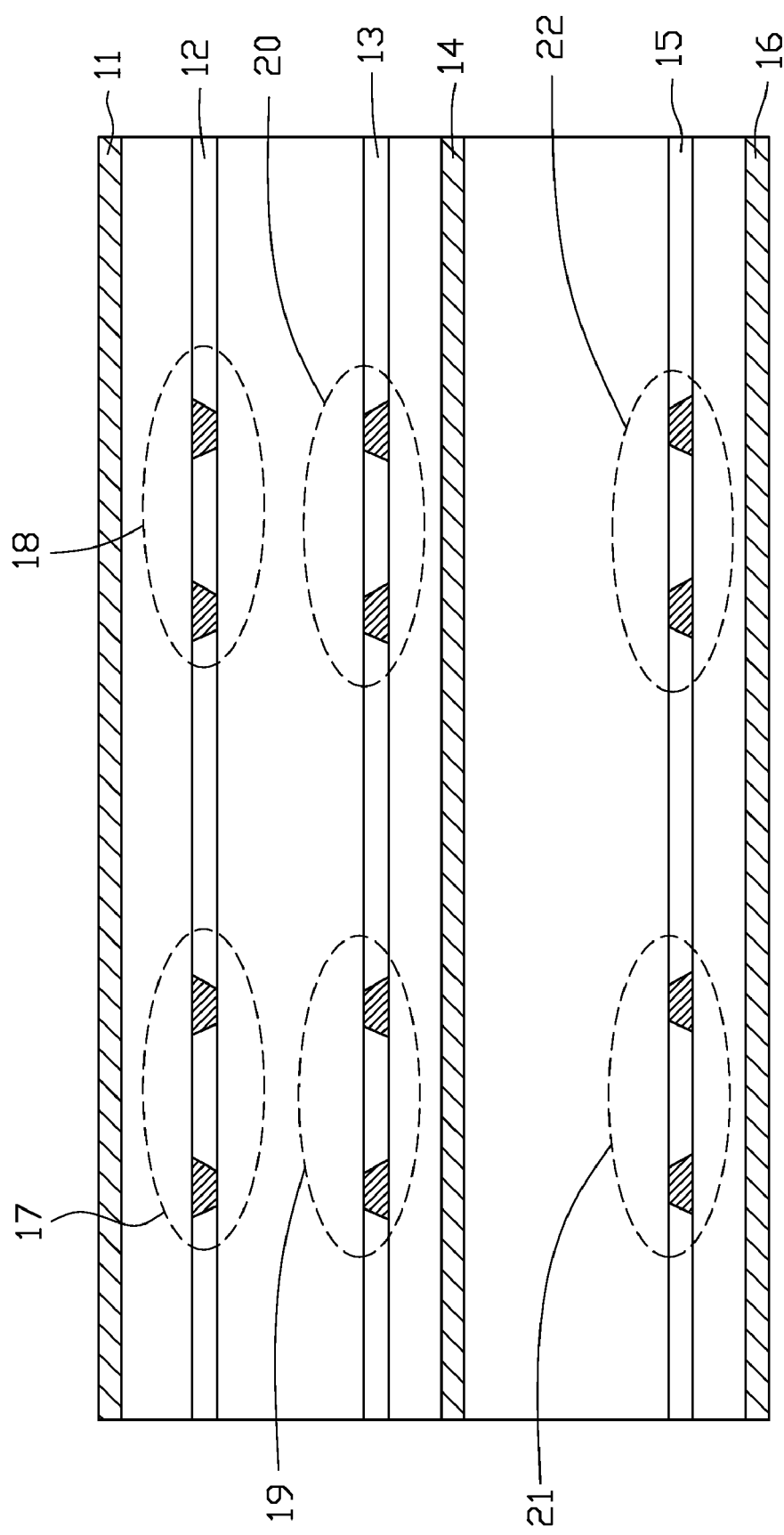
FIG. 2 is a cross-sectional view of a PCB according to the prior art.

Referring to FIG. 1, a PCB in accordance with an embodiment of the present invention includes a first reference layer 31, a first signal layer 32, a second signal layer 33, a third signal layer 34, and a second reference layer 35 in order. Two edge-coupled differential pairs 37, 38 are formed in the first signal layer 32. An edge-coupled differential pair 39, a first ground part 361, and a second ground part 362 are arranged in the second signal layer 33. The first and second ground parts 361, 362 are symmetrically arranged at opposite sides of the differential pair 39. The differential pair 37 is arranged above the first ground part 361 and a projection of the differential pair 37 onto the second signal layer 33 has an area coincident with the first ground part 361. The differential pair 38 is arranged above the second ground part 362 and a projection of the differential pair 38 onto the second signal layer 33 has an area coincident with the second ground part 362. Two edge-coupled differential pairs 40, 41 are formed in the third signal layer 34. The differential pair 40 is arranged below the first ground part 361 and a projection of the differential pair 40 onto the second signal layer 33 has an area coincident with the first ground part 361. The differential pair 41 is arranged below the second ground part 362 and a projection of the differential pair 41 onto the second signal layer 33 has an area coincident with the second ground part 362. The differential pairs 37, 38 reference the first reference layer 31, the differential pair 39 reference the first and second ground parts 361, 362 respectively, and the differential pairs 40, 41 reference the second reference layer 35. Compared to the conventional PCB, the differential pair 39 and the first and second ground parts 361, 362 are arranged in the same signal layer 33. Thus, the first and second ground parts 361, 362 do not occupy inner layers of the PCB as the reference layer, therefore the density layout of differential pairs is increased. The differential pairs 37, 38 can also reference the first and second ground parts 361, 362 respectively. The differential pairs 40, 41 can also reference the first and second ground parts 361, 362 respectively. Therefore, noise signals in the differential pairs between the signal layers can be further restrained.

In this embodiment, a plurality of differential pairs can be arranged in the first and third signal layers 32, 34, and a plurality of differential pairs and corresponding ground parts can be arranged in the second signal layer 33. In practice, when the differential pairs in the first signal layer 32 are respectively arranged over corresponding ground parts in the second signal layer 33, and the differential pairs in the third signal layer 34 are respectively arranged under corresponding ground parts in the second signal layer 33. Noise signal in the differential pairs between the signal layers are minimized.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A printed circuit board (PCB) comprising:
a first reference layer, a first signal layer, and a second signal layer in that order;

a first differential pair arranged in the first signal layer in an edge-coupled structure referencing the first reference layer;

a second differential pair arranged in the second signal layer in edge-coupled structure;

a first ground part and a second ground part symmetrically arranged in the second signal layer and at opposite sides of the second differential pair, the first differential pair arranged above the first ground part such that a projection of the first differential pair onto the second signal layer having an area coincident with the first ground part, the second differential pair referencing the first and second ground parts.

2. The PCB as claimed in claim 1, further comprising a third differential pair arranged in the first signal layer in edge-coupled structure, the third differential pair referencing the first reference layer and is arranged over the second ground part.

3. The PCB as claimed in claim 1, further comprising:

a third signal layer and a second reference layer arranged under the second signal layer in that order;

a fourth differential pair and a fifth differential pair arranged in the third signal layer in edge-coupled structure, the fourth and fifth differential pairs both referencing the second reference layer and respectively arranged under the first and second ground parts.

4. The PCB as claimed in claim 3, further comprising a third differential pair arranged in the first signal layer in edge-coupled structure, the third differential pair referencing the first reference layer and is arranged over the second ground part.

* * * * *